(12) United States Patent
Yokoyama et al.

(10) Patent No.: US 6,216,941 B1
(45) Date of Patent: Apr. 17, 2001

(54) METHOD FOR FORMING HIGH FREQUENCY CONNECTIONS TO HIGH TEMPERATURE SUPERCONDUCTOR CIRCUITS AND OTHER FRAGILE MATERIALS

(75) Inventors: Karen E. Yokoyama, Rancho Palos Verdes; Gershon Akerling; Moshe Sergant, both of Culver City, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/478,255

(22) Filed: Jan. 6, 2000

(51) Int. Cl.[7] .......................... B23K 31/00; B23K 31/02; H01L 21/027; H01L 21/203; H01L 21/36

(52) U.S. Cl. ................. 228/180.22; 228/121; 228/123.1; 29/599; 438/2; 438/119; 438/614; 438/708; 438/725; 427/62; 427/123; 427/126.1

(58) Field of Search .............................. 228/180.22, 178, 228/6.2, 121, 123.1; 29/599; 438/2, 119, 66, 67, 614, 708, 725; 427/62, 123, 126.1

(56) References Cited

U.S. PATENT DOCUMENTS

| | | | |
|---|---|---|---|
| 5,092,032 | * | 3/1992 | Murakami . |
| 5,773,875 | * | 6/1998 | Chan . |
| 5,977,642 | * | 11/1999 | Appelt et al. . |
| 5,986,348 | * | 11/1999 | Fukano . |
| 6,055,723 | * | 5/2000 | Akerling et al. . |

* cited by examiner

Primary Examiner—Patrick Ryan
Assistant Examiner—Colleen Cooke
(74) Attorney, Agent, or Firm—Michael S. Yatsko

(57) ABSTRACT

A method for forming high frequency connections between a fragile chip and a substrate is described, wherein metal is selectively deposited on a surface of a chip and a surface of a substrate, and corresponding patterns of electrically conductive bumps are selectively evaporated on the surface of the chip and the surface of the substrate over the metal layers, to form a pattern of electrically conductive bumps having spongy and dendritic properties, placing the chip in aligned contact with the substrate where each electrically conductive chip bump mates with each corresponding electrically conductive substrate bump, and selectively applying heat and pressure to the chip and substrate causing each chip bump to fuse together with each corresponding substrate bump to form an electromechanical bond.

12 Claims, 3 Drawing Sheets

METHOD FOR FORMING HIGH FREQUENCY CONNECTIONS TO HIGH TEMPERATURE SUPERCONDUCTOR CIRCUITS AND OTHER FRAGILE MATERIALS

BACKGROUND OF THE INVENTION

1. Field of the Invention

The present invention relates generally to device interconnection techniques, and more specifically to a method for attaching high temperature superconductive (HTS) microelectronic chips (i.e., any substrate material onto which an HTS film is deposited) and similar fragile circuits directly to HTS substrates and similar fragile materials.

2. Description of the Prior Art

Rapid advances in technology have accelerated the need for device interconnections that can satisfy increased speed without compromising yield or reliability. Specifically, as the development of high temperature superconductive (HTS) electronics mature, the need for making high frequency connections to these HTS circuits becomes essential.

Conventional device interconnection techniques may include wire bonding, flip chip solder reflow bonding, or flip chip cold weld bonding. Flip-chip bonding tends to be particularly popular since microelectronic circuits having higher input/output densities may be fabricated, thereby allowing more functions to be incorporated in a single package. Unlike other conventional interconnect methods, flip-chip attachment provides interconnections that can operate at multi-GHz speeds.

However, conventional solder reflow and cold weld flip-chip bonding methods fail to address the mechanical fragility and chemical sensitivity of high temperature superconductive films and substrates. For example, in one method of flip-chip bonding known in the art as "cold weld" attachment, metal bumps are deposited on a surface of a device chip and on a surface of a substrate. The metal bumps of the chip are brought into contact with the corresponding metal bumps of the substrate where pressure is applied causing the metal bumps from the chip and the substrate to deform and flow together forming an electromechanical connection. However, this cold weld flip-chip bond method is unsuitable for HTS and similarly fragile chips. Specifically, HTS chips are composed of superconducting films that are epitaxially grown on structurally fragile substrate materials. Using conventional cold weld methods, HTS chips and substrates are vulnerable because the amount of pressure that is typically required for making a reliable electromechanical connection is greater than the HTS substrate material can withstand without fracturing.

Flip-chip bonding methods that utilize chemicals during the attachment process present additional problems because of the chemical sensitivity of HTS film layers. For example, in an alternative method of flip-chip bonding, a conductive pattern of bumps formed on a surface of a chip is mounted and mated to a corresponding pattern formed on the surface of a substrate by reflow soldering using heat and an oxide reducing chemical agent while applying pressure. Here, the amount of pressure typically applied is minimal and therefore the HTS substrate is not susceptible to fracture. However, the chemicals used to reduce oxide contaminants on the surface of the solder will destroy the HTS film.

Based on the techniques known in the art for bonding chips to substrates, a flip-chip bonding method that provides high bandwidth connections and strong metallurgical bonds while accommodating the chemical sensitivity of HTS films and the fragility of the substrate materials onto which the HTS films are deposited is highly desirable.

SUMMARY OF THE INVENTION

It is an aspect of the present invention to provide a method for forming high frequency connections between a chip and a substrate. The method includes the step of selectively depositing metal on a surface of the chip and the surface of the substrate to respectively form metal layers on the chip surface and the substrate surface. Selectively forming a pattern of electrically conductive bumps on the chip surface over the metal layer so that each electrically conductive bump forms a spongy and dendritic structure. Selectively forming a pattern of electrically conductive bumps on the substrate surface over the substrate metal layer such that each electrically conductive bump forms a spongy and dendritic structure, and the substrate bump pattern correspondingly matches the chip bump pattern. Placing the chip in aligned contact with the substrate where each electrically conductive chip bump mates with each corresponding electrically conductive substrate bump, and selectively applying heat and pressure to the chip and substrate causing each chip bump to fuse with each corresponding substrate bump to form an electromechanical bond.

BRIEF DESCRIPTION OF THE DRAWINGS

Reference is now made to the following specification and attached drawings, wherein:

FIGS. 2a–2g are cross-sectional view illustrations of the process for forming conductive bump patterns on substrates according to the method of the present invention;

DETAILED DESCRIPTION OF THE INVENTION

Figure 4:
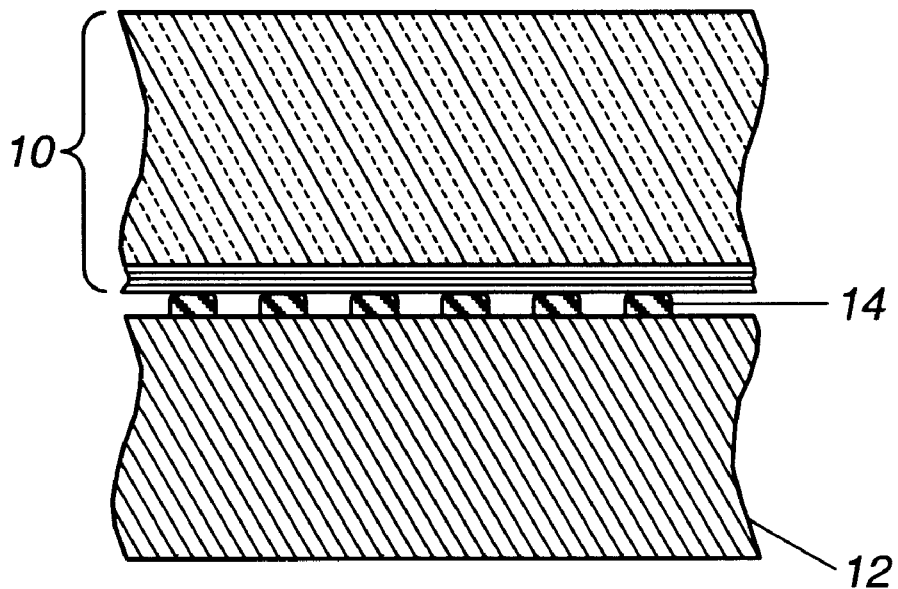
FIG. 4 is a cross-sectional view illustration of a fragile superconductor chip, flip-chip bonded to a substrate according to the method of the present invention.

Referring to FIG. 4, the present invention discloses a high temperature superconductor (HTS) device chip 10 connected to a substrate 12 by a flip-chip mount method that includes a modified indium cold weld attach (or indium compression weld attach) process. The HTS chip 10 is connected to the substrate 12 circuit via electromechanical bond contacts 14. The electromechanical contacts 14 are formed by aligning a pattern of electrically conductive, spongy, and dendritic indium (In) bumps deposited on a surface of the HTS chip 10 to a corresponding pattern of electrically conductive, spongy, and dendritic indium bumps deposited on a surface of the substrate 12, and selectively applying heat and pressure to fuse the mating indium bump pairs.

Figure 2G:
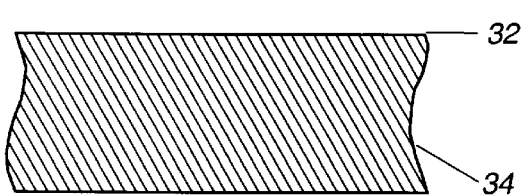
Figure 2G:
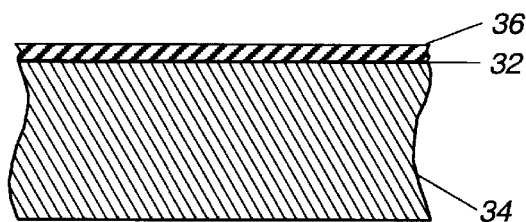
Figure 2G:
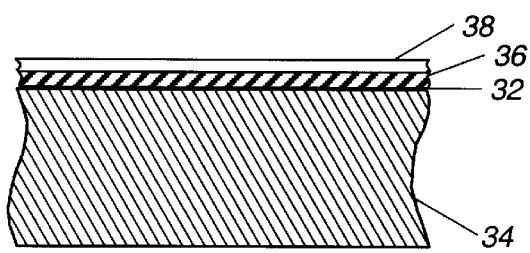
Figure 2G:
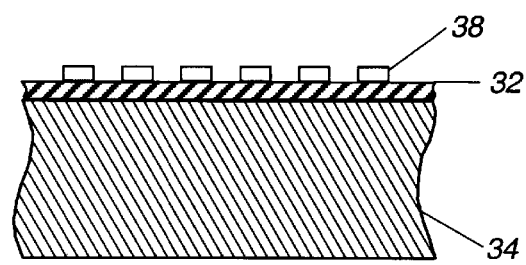
Figure 2G:
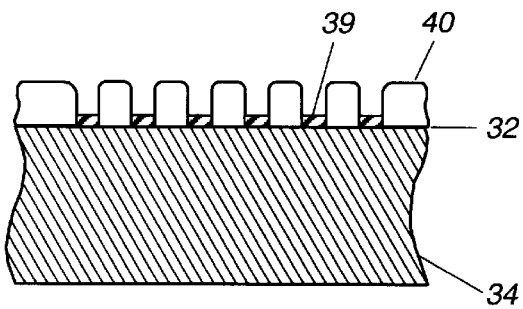
Figure 2G:
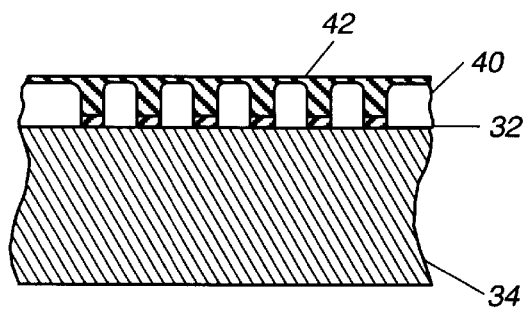
Figure 2G:
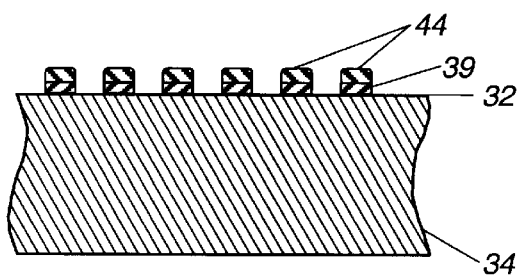
Figure 3:
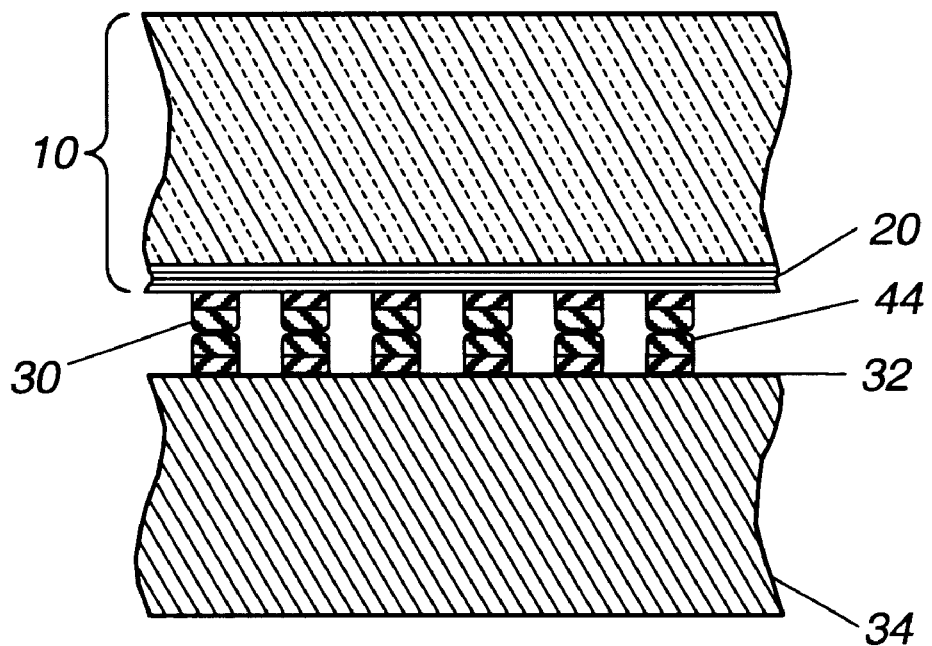
FIG. 3 is a cross-sectional view illustration of attaching a fragile superconducting chip to a substrate according to the method of the present invention.

Referring to FIGS. 1, 2 and 3, the method for producing high frequency connections to fragile high temperature superconductor circuits is described.

Figure 1A:
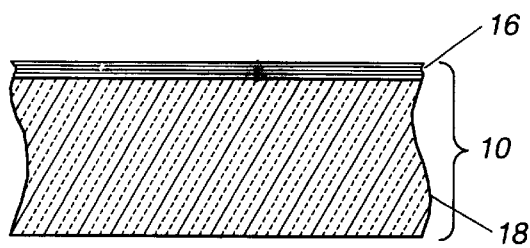
FIGS. 1a–1g are cross-sectional view illustrations of the process for forming conductive bump patterns on fragile superconducting chips according to the method of the present invention.

As shown in FIG. 1a, a high temperature superconductor chip 10 is illustrated containing high temperature superconductor films 16 formed on a fragile substrate 18. The substrate 18 materials may include lanthanum aluminate (LaAlO$_3$), strontium titinate (SrTiO$_3$), neodymium gallate (NdGaO$_3$), gallium arsenide (GaAs) or similar fragile materials having crystal lattice properties that match those of the high temperature superconducting films. The superconducting films 16 may include yttrium barium copper oxide (YBCO), or other similar HTS film materials.

Figure 1B:
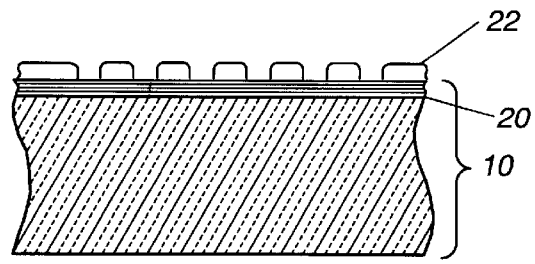

Referring to FIG. 1b, using standard photolithography, a surface 20 of the superconductor chip 10 is coated with photoresist material to form a photoresist mask 22 corresponding to the preferred pattern of electrically conductive, spongy, and dendritic indium bumps. The photoresist coat material may be applied by spinning, dipping, or other similar casting methods, and may be selected from any photosensitive polymer material.

Figure 1C:
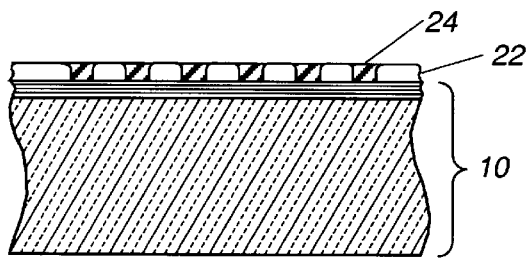

Referring to FIG. 1c, in a process known in the art as "under bump metallization," metal is evaporated over the mask pattern 22 to form a protective metal layer 24 on which each of the indium bumps are later deposited. For the purposes of the present embodiment, the preferred metal layer material is double deposited silver. However, it is important to note that the metal layer material is selected based on the particular device application and may be selected from a variety of metals or metal compounds, including gold, or palladium. The device application also determines the number of metal layers deposited during metallization.

Figure 1D:
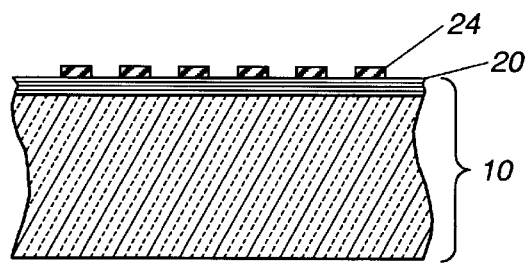

As shown in FIG. 1d, following under bump metallization, the photoresist 22 is stripped from the surface 20 of the chip 10 to expose the protective metal layer 24 formed in the pattern of the photoresist mask.

Figure 1E:
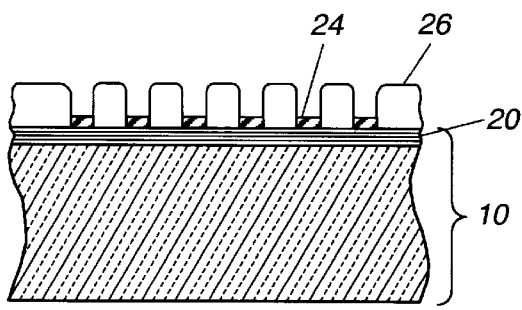

Next, referring to FIG. 1e, a second photoresist mask 26 is formed on the surface 20 of the chip 10 using standard photolithography. The photoresist material is applied to the required thickness and selected from materials known in the art for allowing subsequent etch or lift off processes in microcircuit device fabrication.

Figure 1F:
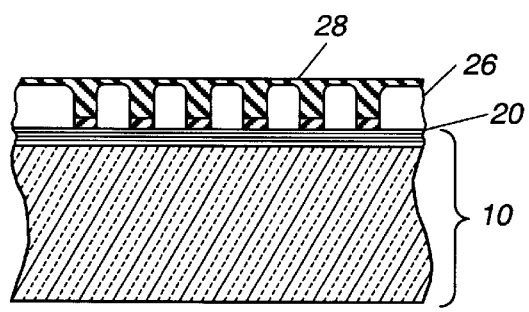
Figure 1G:
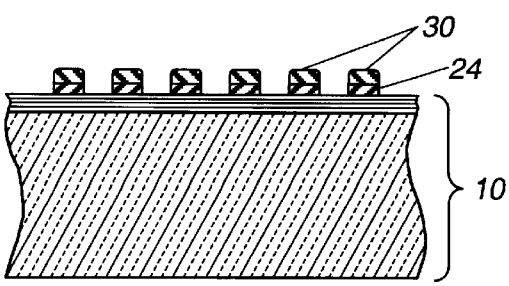

As shown in FIG. 1f, indium 28 is selectively evaporated over the surface 20 of the chip 10 containing the second photoresist mask 26 to produce the pattern of electrically conductive, spongy, and dendritic indium bumps. The selective evaporation of the indium material 28 includes performing the evaporation at a temperature sufficient to produce bump-like structures 30 having spongy and dendritic properties which, when attached to correspondingly similar bump-like structures, form interlocking electromechanical connections. For the purposes of the preferred embodiment of the present invention, the evaporation rate is chosen between approximately 25 and 100 angstroms/sec at a temperature of from approximately 156° C. to 500° C. The resulting electrically, conductive, spongy, and dendritic indium bump structures preferably range from a diameter of 25 microns to 150 microns with a height of from approximately 1 to 25 microns. Next, as shown in FIG. 1g, the second photoresist layer 26 is lifted off from the surface 20 of the chip 10 to expose the pattern of electrically conductive, spongy, and dendritic indium bumps 30.

FIG. 2 illustrates, similar to the processing steps shown in FIG. 1, forming on a surface 32 of a substrate 34, a pattern of electrically conductive, spongy, and dendritic indium bumps that correspondingly match the pattern of electrically conductive, spongy, and dendritic indium bumps 30 formed on the surface 20 of the HTS chip 10.

Referring to FIGS. 2a and 2b, a layer of metal 36 is deposited over the surface 32 of the substrate 34. The metal layer 36 material may include gold, silver, or palladium. The substrate materials may include lanthanum aluminate (LaAlO$_3$), strontium titinate (SrTiO$_3$), neodymium gallate (NdGaO$_3$), or any other substrate material suitable for integration with HTS films.

Referring to FIG. 2c, the metal layer 36 is coated with a photoresist material 38 to form a mask corresponding to the preferred pattern of conductive bumps. The photoresist coat 38 is applied using methods and materials similar to those described in previous bump fabrication steps. Next as shown in FIG. 2d, the photoresist 38 is patterned and the metal layer 36 is etched or lifted off to form an under bump metallization wiring layer 39.

Referring to FIG. 2e, a second photoresist mask 40 is formed on the surface 32 of the substrate 34 using standard photolithography and, as shown in FIG. 2f, indium metal 42 is deposited over the surface 32 of the substrate 34 containing the second photoresist mask 40 to produce the pattern of electrically conductive, spongy, and dendritic indium bumps 44. Next, as illustrated in FIG. 2g, the second photoresist layer 40 is lifted off from the surface 32 of the substrate 34 to expose the pattern of indium bumps 44.

Using the selective evaporation process previously described, electrically conductive indium bump structures 44 are formed on the surface 32 of the substrate 34 having spongy and dendritic characteristics. By forming both the chip bumps 30 and the substrate bumps 44 in manner that creates characteristically spongy and dendritic structures, strong metallurgical bonds may be formed between the chip 10 and the substrate 34 using the attachment process later described.

To address the specific requirements of flip-chip attachment of HTS chips and other fragile materials to substrates, the present invention describes a modified indium compression weld attach process that is performed at elevated temperatures. As illustrated in FIG. 3, after conventional chip and substrate preparation operations (not shown) that include surface cleaning, photoresist coating, wafer cutting and photoresist coat removal, the chip surface 20 containing the pattern of electrically conductive, spongy and dendritic bumps 30 is aligned with the electrically conductive, spongy, and dendritic bump pattern 44 on the substrate surface 32. The mating patterns of the indium bumps (30, 44) are brought into contact while applying heat at a temperature of from approximately 65° C. to 125° C. and simultaneously applying pressure at from approximately 3300 psi to 5300 psi for a period of approximately 30 seconds forming the electromechanical contacts 14 illustrated in FIG. 4.

It is important to note, that the temperature range described above is elevated above those temperatures typically used in conventional cold weld attach processes. During the attachment of the chip 10 to the substrate 34, the elevated temperature range is chosen to facilitate bonding of the indium bump material and at the same time not causing damage to the fragile HTS material and substrate.

The combination of using spongy, dendritic indium bump metallurgy in addition to elevated temperatures to soften the electrically conductive indium bump material additionally reduces the amount of pressure that would typically be required in a conventional cold weld attachment process. This reduction in pressure enables the compression weld flip-chip attachment of HTS and other fragile materials without destroying the properties of these fragile materials and produces bonds that have 50% of the tensile strength of indium metal.

Obviously, many modifications and variations of the present invention are possible in light of the above teachings. Thus, it is to be understood that, within the scope of the appended claims, the invention may be practiced otherwise than as specifically described above.

What is claimed is:

1. A method for forming connections between a chip and a substrate comprising:

selectively depositing a first metal layer on a surface of said chip;

selectively depositing a second metal layer on a surface of said substrate;

selectively forming a pattern of electrically conductive bumps on said chip surface over said first metal layer such that each of said electrically conductive bumps forms a spongy and dendritic structure;

selectively forming a pattern of electrically conductive bumps on said substrate surface over said second metal layer such that each of said electrically conductive bumps forms a spongy and dendritic structure, and, wherein said substrate electrically conductive bump pattern correspondingly matches said chip electrically conductive bump pattern;

selectively placing said chip in aligned contact with said substrate, wherein each said chip electrically conductive bump mates with each said corresponding substrate electrically conductive bump; and selectively applying heat and pressure to said chip and said substrate, thereby causing each said chip electrically conductive bump and each said corresponding substrate electrically conductive bump to fuse and form an electromechanical bond.

2. The method as recited in claim 1, wherein selectively depositing said metal layer to said chip surface further comprises:

forming a lift off pattern of photoresist on said chip surface wherein selected areas of said chip surface are not covered by the photoresist, said selected areas corresponding to said chip electrically conductive bump pattern;

depositing by evaporation, said metal over said entire chip surface; and lifting off said pattern of photoresist from said chip surface.

3. The method as recited in claim 1, wherein selectively depositing said metal layer to said substrate surface further comprises:

depositing by evaporation, said metal layer over said entire substrate surface;

forming a lift off pattern of photoresist on said metal layer wherein selected areas of said metal layer are not covered by the photoresist, said selected areas corresponding to said substrate electrically conductive bump pattern;

etching said metal layer to form a wiring layer; and lifting off said pattern of photoresist from said substrate surface.

4. The method as recited in claim 1, wherein selectively depositing said metal layer to said chip surface comprises selecting said metal layer material from the group consisting of gold, silver, and palladium.

5. The method as recited in claim 1, wherein selectively depositing said metal layer to said substrate surface comprises selecting said metal layer material from the group consisting of gold, silver, and palladium.

6. The method as recited in claim 1, wherein selectively forming said pattern of electrically conductive bumps on said chip surface comprises evaporating said electrically conductive bumps.

7. The method as recited in claim 6, wherein evaporating said pattern of electrically conductive bumps on said chip surface comprises evaporating indium (In) at a rate of between approximately 25 to 100 angstroms per second.

8. The method as recited in claim 6, wherein evaporating said pattern of electrically conductive bumps on said chip surface comprises evaporating indium (In) at a temperature of from approximately 156° C. to 500° C.

9. The method as recited in claim 1, wherein selectively forming said pattern of electrically conductive bumps on said substrate surface comprises evaporating said electrically conductive bumps.

10. The method as recited in claim 9, wherein evaporating said pattern of electrically conductive bumps on said substrate surface comprises evaporating indium (In) at a rate of between approximately 25 to 100 angstroms per second.

11. The method as recited in claim 9, wherein evaporating said pattern of electrically conductive bumps on said substrate surface comprises evaporating indium (In) at a temperature of from approximately 156° C. to 500° C.

12. The method as recited in claim 1, wherein selectively applying heat and pressure to said chip and said substrate further comprises:

applying pressure at from approximately 3300 psi to 5300 psi at a temperature of from approximately 65° C. to 125° C. for a period of time measured from the initial surface contact between said chip bumps and said corresponding substrate bumps.

* * * * *